United States Patent
Tong et al.

(10) Patent No.: US 10,126,329 B2
(45) Date of Patent: Nov. 13, 2018

(54) FORCE BIASED SPRING PROBE PIN ASSEMBLY

(71) Applicant: Texas Instruments Incorporated, Dallas, TX (US)

(72) Inventors: Kay Chan Tong, Plano, TX (US); Hisashi Ata, Murphy, TX (US); Thiha Shwe, Murphy, TX (US); Phillip Marcus Blitz, Farmers Branch, TX (US); Dennis Anhalt, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 388 days.

(21) Appl. No.: 14/981,044

(22) Filed: Dec. 28, 2015

(65) Prior Publication Data
US 2017/0184633 A1    Jun. 29, 2017

(51) Int. Cl.
  *H01R 13/24* (2006.01)
  *G01R 1/067* (2006.01)
  *H01R 11/18* (2006.01)

(52) U.S. Cl.
  CPC .......... *G01R 1/06722* (2013.01); *H01R 11/18* (2013.01); *H01R 13/2421* (2013.01); *H01R 13/2428* (2013.01)

(58) Field of Classification Search
  CPC . H01R 11/18; H01R 13/2421; H01R 13/2428
  (Continued)

(56) References Cited

U.S. PATENT DOCUMENTS 7,315,176 B2 *   1/2008   Nelson ............... G01R 1/06722
                                                            324/755.05
8,905,795 B2 * 12/2014   Kim ....................... H01R 13/62
                                                                439/482
(Continued)

*Primary Examiner* — Tho D Ta
(74) *Attorney, Agent, or Firm* — Ronald O. Neerings; Charles A. Brill; Frank D. Cimino

(57) ABSTRACT

A force biased spring probe pin assembly includes a barrel member having a barrel wall defining an elongate internal cavity with a lower end and an upper end. The assembly also includes a split plunger member comprised of an upper split plunger part separated from a lower split plunger part separated by a diagonal cut reciprocally mounted in the internal cavity proximate the lower end of the internal cavity. A spring member is positioned in the internal cavity between the upper split plunger part and the second end of the internal cavity. A force biased spring probe pin assembly includes a barrel member having a barrel wall defining an elongate internal cavity with a lower end and an upper end. The assembly also includes a first split plunger member reciprocally mounted in the internal cavity proximate the lower end of the internal cavity and a second split plunger member reciprocally mounted in the internal cavity proximate the upper end of the internal cavity. The first and second split plunger members are each comprised of two parts: a first upper plunger part separated from a first lower plunger part by a diagonal cut. A spring member is positioned in the internal cavity between the first and second upper split plunger parts. In each split plunger the diagonal surface of the upper split plunger part exerts a transverse force to the diagonal surface of the lower split plunger part ensuring good electrical contact between the lower split plunger member part and the barrel wall.

31 Claims, 6 Drawing Sheets

(58) Field of Classification Search
USPC .................................................. 439/700, 824
See application file for complete search history.

(56) References Cited

U.S. PATENT DOCUMENTS 9,385,461 B2 * 7/2016 Mori .................. H01R 13/2421
9,431,742 B2 * 8/2016 DiFonzo ................ H01R 13/17

* cited by examiner

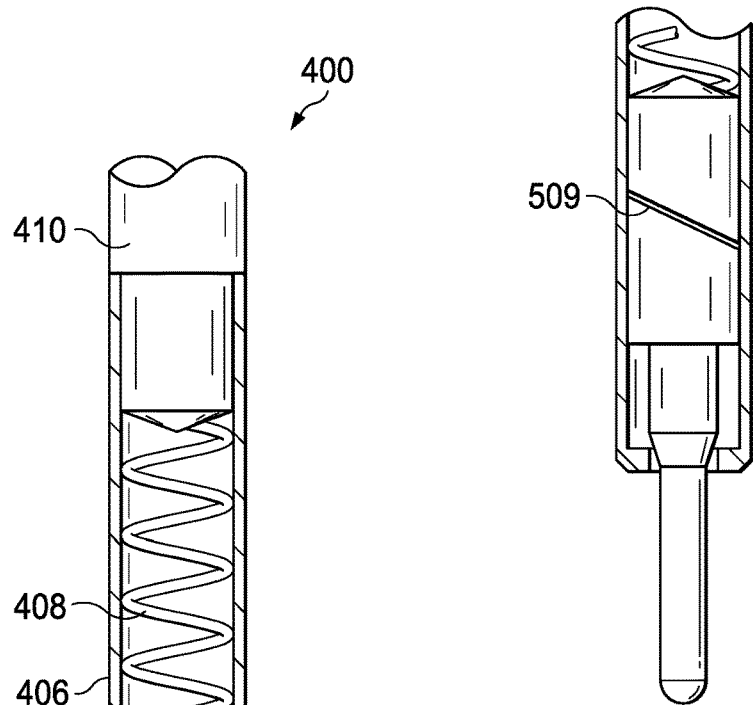
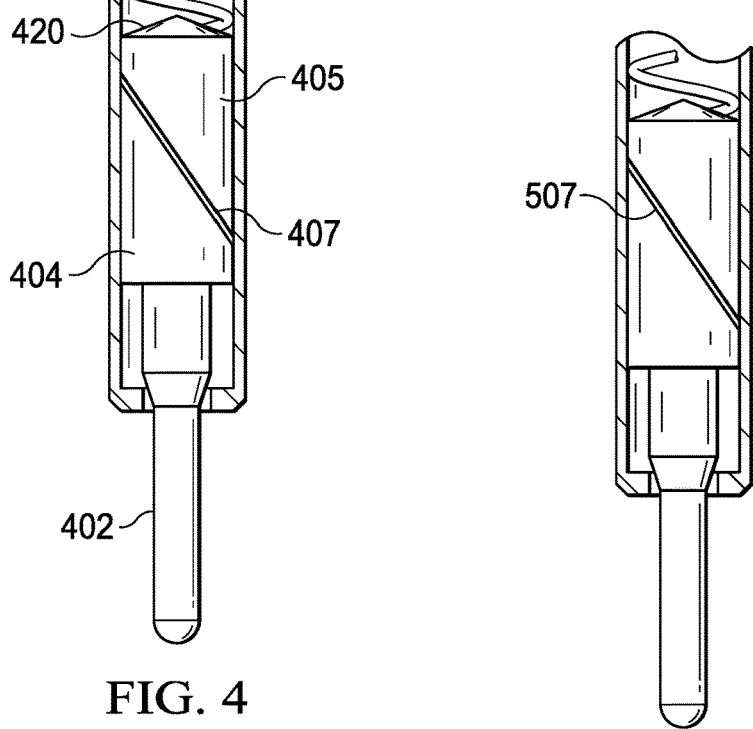
FIG. 4
FIG. 5A
FIG. 5B

FORCE BIASED SPRING PROBE PIN ASSEMBLY

CROSS REFERENCE TO RELATED APPLICATIONS

The following co-pending patent applications are related and hereby incorporated by reference: U.S. patent application Ser. No. 14/980,753, now U.S. Pat. No. 9,698,513, filed simultaneously with this application, U.S. patent application Ser. No. 14/980,877, now U.S. Pat. No. 9,775,344, filed simultaneously with this application, and U.S. patent application Ser. No. 14/981,953, filed simultaneously with this application. With the mention in this section, these patent applications are not admitted to be prior art with respect to the present invention.

This application is related to patent application Ser. No. 14/863,198, filed Sep. 23, 2015, now U.S. Pat. No. 9,673,539, entitled "Spring Biased Probe Pin Assembly," with its mention in this section, this patent application is not admitted to be prior art with respect to the present invention.

FIELD

This invention relates a force biased spring probe pin assembly also known as a pogo pin.

BACKGROUND

A spring probe pin assembly is often also referred to as a Pogo™ pin. Pogo™ is a registered trademark of Xcerra Corporation in Norwood, Mass. A spring probe pin or Pogo™ assembly is a device used in electronics to establish an electrical connection between two circuits. Pogo™ pins are usually arranged in a dense array, connecting together many individual nodes of two circuits or circuit boards. Pogo™ pin connectors are commonly found in automatic test equipment (ATE) in the form of a bed of nails where they facilitate the rapid, reliable connection of the devices under test. A Pogo™ pin connector may contain just a few Pogo™ pins to many hundred Pogo™ pins. In one extremely high-density configuration, the array takes the form of a ring containing hundreds or thousands of individual pogo pins; this device is sometimes referred to as a pogo tower.

Pogo™ pin connectors are also commonly used to form reliable, non permanent electrical contacts in electrical equipment. For example an electronic device with multiple electrical connections may be plugged into an piece of electrical equipment and secured in place for example by a snap connector, a spring, or screws. A Pogo™ pin connector may be used to establish electrical connection. An electronic device installed in electrical equipment in this manner may be easily be removed and replaced without the need of special equipment. This is especially convenient for repairing or updated electrical equipment in the field. For example, Pogo™ pin connectors are used for the installation of devices in the Cray 2 computer.

As shown in FIG. 1, a spring probe pin assembly 100 may have one movable probe pin 102 at one end of the cylindrical barrel member 106 and an immovable pin 116 attached to a closed end of the cylindrical barrel member 106. As shown in FIG. 2 the spring probe pin assembly 200 may have two movable probe pins, 202 and 216, one at each opposing open ends of the cylindrical barrel member 106.

The spring 108 forces the plunger 104 (or plungers 204 and 210 in FIG. 2) into electrical contact with the wall of the barrel member 106. As is illustrated by the arrows 112 in FIG. 1, the current typically flows from the probe pad on the integrated circuit through the probe pin 102, through the plunger 104, through the wall of the barrel member 106, and into the head 110 of the spring probe pin assembly (or the upper plunger 210 and the upper probe pin 216 in FIG. 2).

Although the spring 108 typically forms an electrical path in parallel with the cylindrical barrel member 106 of the spring probe pin assembly, the resistance of the spring is typically so much higher than the resistance of the wall of the barrel member 106 that an insignificant amount of current flows through the spring 108.

A common problem that may arise with a conventional spring probe pin assembly 300 during use is illustrated in FIG. 3. After repeated use, due to wear the contact 314 and 316 between the plunger 304 and the wall of the barrel member 306 may be degraded resulting in increased resistance. The increased resistance may result in an increase in current flowing through the spring 308. Current greater than about 200 mA through the spring 308 of a spring probe pin assembly 300 may cause the spring 308 to heat up and lose temper or may cause the spring 308 to melt.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A force biased spring probe pin assembly includes a barrel member having a barrel wall defining an elongate internal cavity with a lower end and an upper end. The assembly also includes a split plunger member comprised of an upper split plunger part separated from a lower split plunger part separated by a diagonal cut reciprocally mounted in the internal cavity proximate the lower end of the internal cavity. A spring member is positioned in the internal cavity between the upper split plunger part and the second end of the internal cavity. A force biased spring probe pin assembly includes a barrel member having a barrel wall defining an elongate internal cavity with a lower end and an upper end. The assembly also includes a first split plunger member reciprocally mounted in the internal cavity proximate the lower end of the internal cavity and a second split plunger member reciprocally mounted in the internal cavity proximate the upper end of the internal cavity. The first and second split plunger members are each comprised of two parts: a first upper plunger part separated from a first lower plunger part by a diagonal cut. A spring member is positioned in the internal cavity between the first and second upper split plunger parts. In each split plunger the diagonal surface of the upper split plunger part exerts a transverse force to the diagonal surface of the lower split plunger part ensuring good electrical contact between the lower split plunger member part and the barrel wall.

DESCRIPTION OF THE VIEWS OF THE DRAWINGS

FIG. 4 is a partially transparent view of an example embodiment of a force-biased spring probe pin assembly with a two piece (split) plunger.

FIGS. 5A and 5B are a partially transparent expanded views of the two piece (split) plunger in FIG. 4.

DETAILED DESCRIPTION OF EXAMPLE EMBODIMENTS

Embodiments of the invention are described with reference to the attached figures. The figures are not drawn to scale and they are provided merely to illustrate the invention. Several aspects of the embodiments are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The embodiments are not limited by the illustrated ordering of acts or events, as some acts may occur in different orders and/or concurrently with other acts or events. Furthermore, not all illustrated acts or events are required to implement a methodology in accordance with the present invention.

Figure 1:
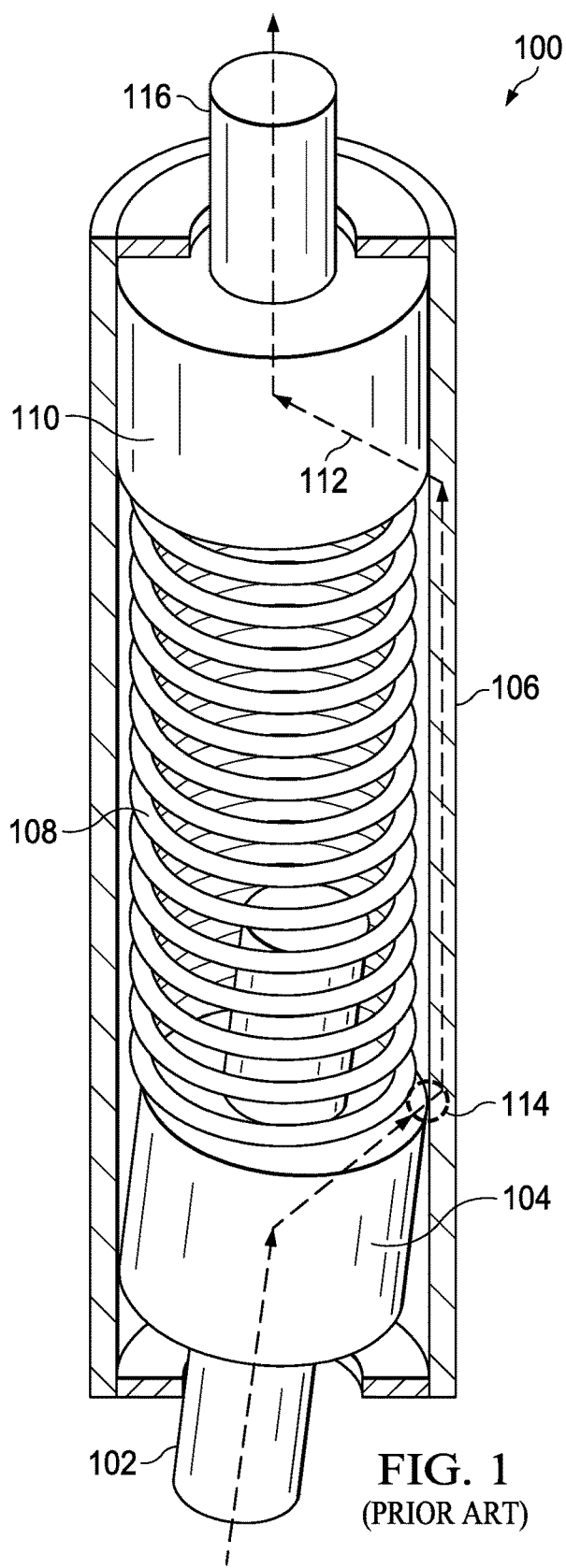
FIG. 1 (Prior art) is a partially transparent view of a prior art single ended spring probe pin assembly.
Figure 2:
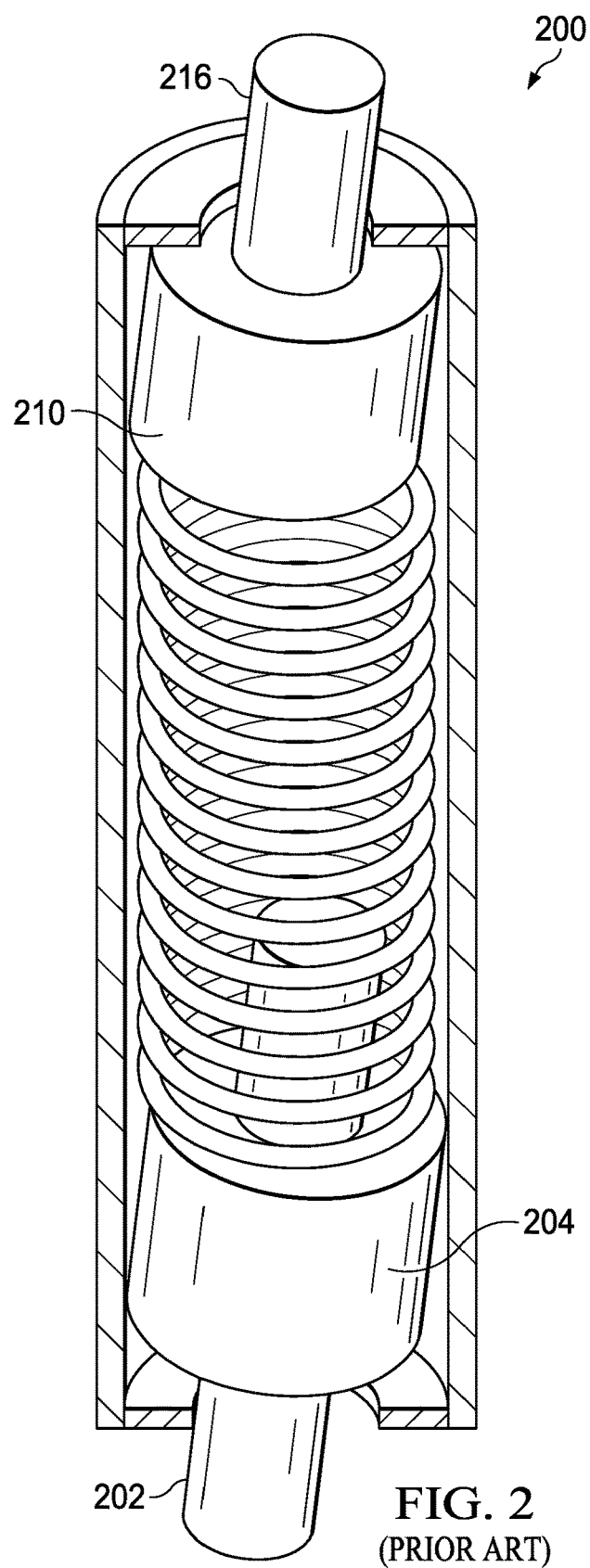
FIG. 2 (Prior art) is a partially transparent view of a prior art dual ended spring probe pin assembly.
Figure 3:
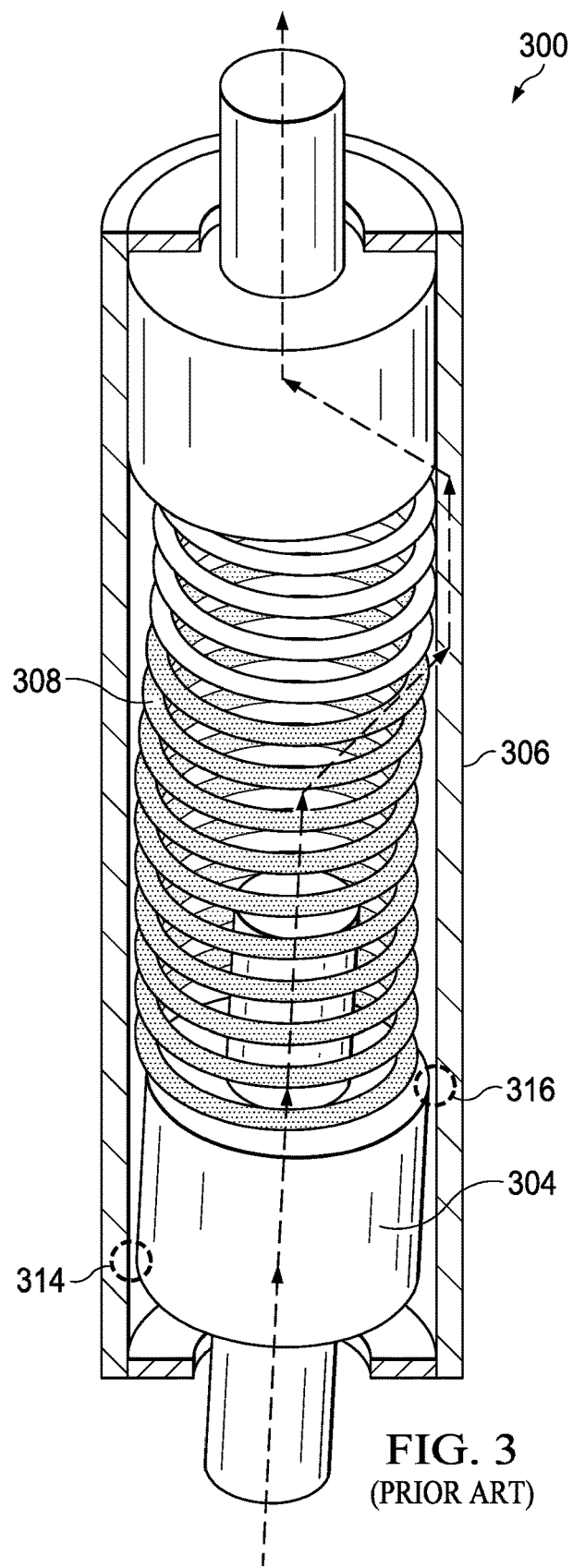
FIG. 3 (Prior art) is a partially transparent view of a failed prior art spring probe pin assembly.
Figure 6:
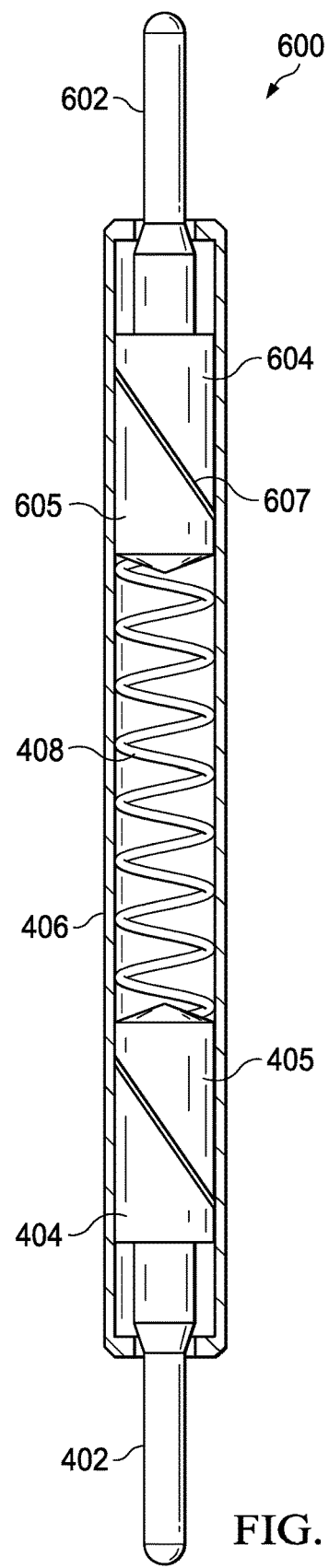
FIG. 6 is a partially transparent view of an embodiment force-biased dual ended spring probe pin assembly with two piece (split) plungers.

Embodiment force-biased spring probe pin assemblies, 400 and 600, are illustrated in FIG. 4 and FIG. 6. FIG. 4 is an embodiment force-biased single ended spring probe pin assembly 400 with a split probe plunger comprised of a lower split plunger member 404 and an upper split plunger member 405 separated by a diagonal cut 407. FIG. 6 is an embodiment force-biased dual ended spring probe assembly 600 with a first split probe member, 404 and 405, and second split probe member, 604 and 605.

As shown in FIG. 4, the embodiment force biased spring probe pin assembly 400 may have one movable probe pin 402 attached to a first split plunger member 404 at one end of the cylindrical barrel member 406 and an immovable pin 410 attached to a closed end of the cylindrical barrel member 406. The movable probe pin 402 is attached to a lower plunger member part, 404. The plunger member is comprised of two parts: a lower plunger member part 404 and an upper member part 405 which are separated from each other by a diagonal cut 407. The split plunger member is reciprocally mounted in the cylindrical barrel member 406. A spring 408 positioned within the cylindrical barrel member 406 applies a downward force to the top of the upper split plunger member part 405. When the movable probe pin 402 contacts a probe pad of an integrated circuit, the split plunger member moves within the cylindrical barrel member 406 causing the spring 408 to compress. There may be hundreds of force biased spring probe pin assemblies in a probe head. The springs 408, split plunger member, and movable probe pin 402 enables hundreds of the movable probe pins 402 to simultaneously form good electrical contact to hundreds of probe pads on an integrated circuit with minimum damage to the probe pads.

When the spring 408 applies a downward force to the upper split plunger member part 405, the surface of the diagonal cut 407 applies a transverse force to the diagonal surface of the lower split plunger member part 404 which ensures good electrical contact between the lower split plunger member part 404 and the cylindrical barrel member 406. The angle of the diagonal cut 509 may be made shallower as shown in FIG. 5A to reduce the transverse force or steeper 507 as shown in FIG. 5B to increase the transverse force. The edges on the surfaces of the diagonal cuts on the upper and lower split plunger member parts 404 and 405 may be rounded to ensure smooth movement of the upper 405 and lower 404 split plunger parts against the inner walls of the cylindrical barrel member 406. The angle between the diagonal cut 407 and the wall of the cylindrical barrel member is typically between about 5 degrees and 25 degrees. In a preferred embodiment the angle is about 10 degrees.

As shown in FIG. 6, the embodiment force biased spring probe pin assembly may have one movable probe pin 402 attached to a first lower split plunger member part 404 at one end of the cylindrical barrel member 406 and a second movable probe pin 602 attached to a second lower split plunger member part 604 at the other end of the cylindrical barrel member 406. A spring 408 positioned in the cylindrical barrel member 406 applies an upward force to the second upper split plunger member part 605 and downward force to the first upper split plunger member part 405. The transverse force applied along the diagonal cuts, 407 and 607, between the upper split plunger member parts, 405 and 605, and the lower split plunger member parts, 404 and 604, ensures good electrical contact to probe pads on integrated circuits with minimal damage to the probe pads.

Figure 7:
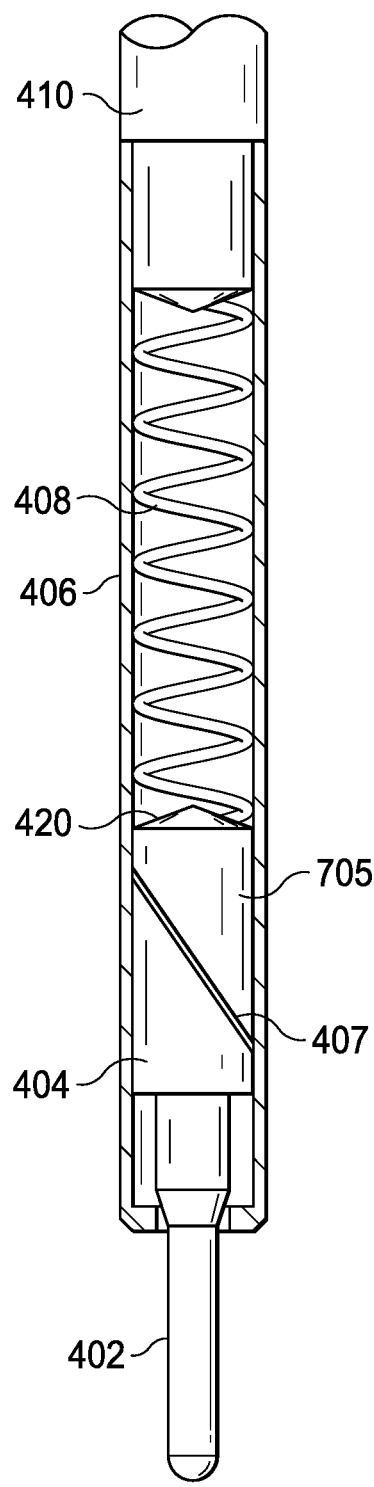
FIG. 7 is a partially transparent view of an example embodiment of a force-biased spring probe pin assembly where the upper part of the two piece (split) plunger is made of non conductive material.

As is illustrated in FIG. 7, the upper split plunger part 705 may be formed of a nonconductive material to reduce the chance of significant current flowing through and damaging the spring 408.

Figure 8:
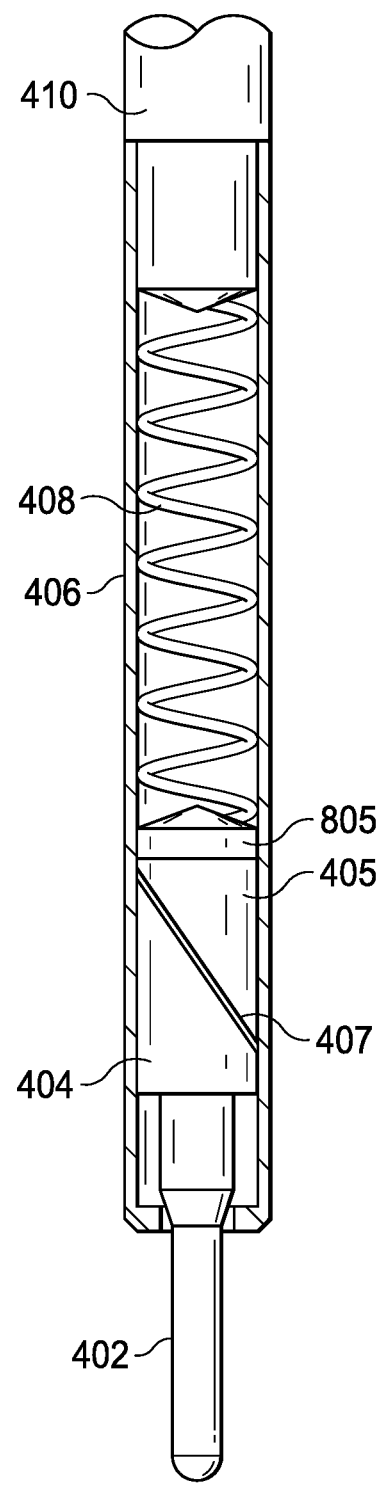
FIG. 8 is a partially transparent view of an example embodiment of a force-biased spring probe pin assembly with an insert made of non conductive material positioned between the spring and the upper part of the two piece (split) plunger.

Optionally as is illustrated in FIG. 8, a cap 805 of non conductive material may be positioned between the upper split plunger part 405 and the spring 408 to reduce the chance of significant current flowing through and damaging the spring 408

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:
1. A force biased spring probe pin assembly comprising:
a cylindrical barrel member having a barrel wall defining an elongate internal cavity with a lower end and an upper end;
a first split plunger member reciprocally mounted in the internal cavity proximate to the lower end of the internal cavity, wherein the first split plunger member is further comprised of an upper split plunger member part and a lower split plunger member part separated by a diagonal cut; and a spring member positioned in the internal cavity between the split plunger member and the upper end of the internal cavity.

2. The assembly of claim 1, wherein the spring probe pin assembly is a Pogo™ assembly.

3. The assembly of claim 1, wherein the upper split plunger member part being in continuous contact with the lower split plunger member part and the lower split plunger member part in continuous contact with the barrel wall.

4. The assembly of claim 1, wherein an angle between the diagonal cut and the cylindrical barrel member is between about 5 degrees and 25 degrees.

5. The assembly of claim 1, wherein an angle between the diagonal cut and the cylindrical barrel member is about 10 degrees.

6. The assembly of claim 1 further including an insert positioned between the upper split plunger member part and the spring member, wherein the insert is comprised of non conductive material.

7. The assembly of claim 1 wherein the upper split plunger member part is comprised of non conductive material.

8. The assembly of claim 1, further comprising a second split plunger member reciprocally mounted in the internal cavity proximate the upper end, wherein the second split plunger member is further comprised of an upper split plunger member part and a lower split plunger member part separated by a diagonal cut.

9. The assembly of claim 8, wherein the elongate internal cavity having a first opening at the lower end and a second opening at the upper end, the first split plunger member comprising a first probe pin extending through the first opening and the second split plunger member comprising a second probe pin extending through the second opening.

10. The assembly of claim 1, wherein the elongate internal cavity having a first opening at the lower end and the first split plunger member comprising a first probe pin extending through the first opening.

11. The assembly of claim 10, further including an immovable pin attached to a closed end of the cylindrical barrel member proximate the upper end of the internal cavity.

12. The assembly of claim 1, wherein edges on surfaces of the diagonal cuts on the upper and lower split plunger member parts are rounded.

13. The assembly of claim 12, wherein the rounded edges on the surfaces of the diagonal cuts on the upper and lower split plunger member parts ensure smooth movement of the upper and lower split plunger parts against inner walls of the cylindrical barrel member.

14. The assembly of claim 1, wherein when the spring member applies a downward force to the upper split plunger member part, a surface of the diagonal cut applies a transverse force to a diagonal surface of the lower split plunger member.

15. The assembly of claim 14, wherein the transverse force applied to the diagonal surface of the lower split plunger member part ensures good electrical contact between the lower split plunger member part and the cylindrical barrel member.

16. The assembly of claim 14, wherein an angle of the diagonal cut may be made shallower to reduce the transverse force or steeper to increase the transverse force.

17. A force biased spring probe pin assembly comprising:
a barrel member having a barrel wall defining an elongate internal cavity with a lower end and an upper end;
a first split plunger member reciprocally mounted in the internal cavity proximate to said lower end of the internal cavity wherein the first split plunger member is further comprised of a first upper split plunger member part and a first lower split plunger member part separated by a diagonal cut;
a second split plunger member reciprocally mounted in the internal cavity proximate to the upper end of the internal cavity, wherein the second split plunger member is further comprised of a second upper split plunger member part and a second lower split plunger member part separated by a diagonal cut; and
a spring member positioned in the internal cavity between the first split plunger member and the second upper split plunger member.

18. The assembly of claim 17, wherein the spring probe pin assembly is a Pogo™ assembly.

19. The assembly of claim 17, with a diagonal surface of the first upper split plunger member part being in continuous contact with and applying transverse force to a diagonal surface of the first lower split plunger member part and the first lower split plunger member part in continuous contact with the barrel wall and with a diagonal surface of the second upper split plunger member part being in continuous contact with and applying transverse force to a diagonal surface of the second lower split plunger member part and the second lower split plunger member part in continuous contact with the barrel wall.

20. The assembly of claim 17, the cylindrical cavity having a first opening at the lower end and a second opening at the upper end, the first split plunger member comprising a first probe pin extending through the first opening and the second split plunger member comprising a second probe pin extending through the second opening.

21. The assembly of claim 17, wherein an angle between said diagonal cut of the first split plunger member and said cylindrical barrel member is between about 5 degrees and 25 degrees.

22. The assembly of claim 17, wherein an angle between the diagonal cut of the first split plunger member and the cylindrical barrel member is about 10 degrees.

23. The assembly of claim 17 further including an insert positioned between at least one of the first and the second upper split plunger member part and the spring member, wherein the insert is comprised of non conductive material.

24. The assembly of claim 17 wherein said at least one of the first and second upper split plunger member part is comprised of non conductive material.

25. The assembly of claim 17, wherein edges on surfaces of the diagonal cuts on the upper and lower split plunger member parts are rounded.

26. The assembly of claim 25, wherein the rounded edges on the surfaces of the diagonal cuts on the upper and lower split plunger member parts ensure smooth movement of the upper and lower split plunger parts against inner walls of the cylindrical barrel member.

27. The assembly of claim 17, wherein when the spring member applies a force to the upper split plunger member parts, surfaces of the diagonal cuts apply a transverse force to a diagonal surface of the upper and lower split plunger members.

28. The assembly of claim 27, wherein the transverse force applied to the diagonal surface of the lower split plunger member parts ensures good electrical contact between the lower split plunger member parts and the cylindrical barrel member.

29. The assembly of claim 27, wherein an angle of the diagonal cuts may be made shallower to reduce the transverse force or steeper to increase the transverse force.

30. A method of making a force biased spring probe pin assembly comprising:
   providing a cylindrical barrel member having a barrel wall defining an elongate internal cavity with a lower end and an upper end;
   providing a first split plunger member reciprocally mourned in the internal cavity proximate to the lower end of the internal cavity, wherein the first split plunger member is further comprised of an upper split plunger member part and a lower split plunger member part separated by a diagonal cut; and
   providing a spring member positioned in the internal cavity between the split plunger member and the upper end of the internal cavity.

31. A method of making a force biased spring probe pin assembly comprising:
   providing a barrel member having a barrel wall defining an elongate internal cavity with a lower end and an upper end;
   providing a first split plunger member reciprocally mounted in the internal cavity proximate to said lower end of the internal cavity wherein the first split plunger member is further comprised of a first upper split plunger member part and a first lower split plunger member part separated by a diagonal cut;
   providing a second split plunger member reciprocally mounted in the internal cavity proximate to the upper end of the internal cavity, wherein the second split plunger member is further comprised of a second upper split plunger member part and a second lower split plunger member part separated by a diagonal cut; and
   providing a spring member positioned in the internal cavity between the first split plunger member and the second split plunger member.

\* \* \* \* \*